United States Patent
Kay et al.

(10) Patent No.: US 11,323,091 B2
(45) Date of Patent: May 3, 2022

(54) TRANSVERSELY-EXCITED FILM BULK ACOUSTIC RESONATOR WITH DIAPHRAGM SUPPORT PEDESTALS

(71) Applicant: Resonant Inc., Goleta, CA (US)

(72) Inventors: Andrew Kay, Irvine, CA (US); Ventsislav Yantchev, Sofia (BG); Patrick Turner, San Bruno, CA (US)

(73) Assignee: Resonant Inc., Austin, TX (US)

( * ) Notice: Subject to any disclaimer, the term of this patent is extended or adjusted under 35 U.S.C. 154(b) by 127 days.

(21) Appl. No.: 17/030,063

(22) Filed: Sep. 23, 2020

(65) Prior Publication Data
US 2021/0028762 A1    Jan. 28, 2021

Related U.S. Application Data

(63) Continuation-in-part of application No. 16/829,617, filed on Mar. 25, 2020, now Pat. No. 10,868,512,
(Continued)

(51) Int. Cl.
*H03H 9/17*    (2006.01)
*H03H 9/54*    (2006.01)
(Continued)

(52) U.S. Cl.
CPC .......... *H03H 9/171* (2013.01); *H03H 9/02* (2013.01); *H03H 9/54* (2013.01); *H03H 9/02015* (2013.01); *H03H 9/13* (2013.01)

(58) Field of Classification Search
CPC   H03H 9/171; H03H 9/02; H03H 9/54; H03H 9/02015; H03H 9/13
(Continued)

(56) References Cited

U.S. PATENT DOCUMENTS 5,446,330 A   8/1995  Eda et al.
5,552,655 A   9/1996  Stokes et al.
(Continued)

FOREIGN PATENT DOCUMENTS

WO   2016017104        2/2016
WO   2018003273 A1    1/2018

OTHER PUBLICATIONS

Buchanan "Ceramit Materials for Electronics" 3rd Edition, first published in 2004 by Marcel Dekker, Inc. pp. 496 (Year 2004). Jan. 2004.
(Continued)

*Primary Examiner* — Hafizur Rahman
(74) *Attorney, Agent, or Firm* — SoCal IP Law Group LLP; Angelo Gaz

(57) ABSTRACT

Acoustic resonator devices and methods are disclosed. An acoustic resonator device includes a substrate having a surface and a piezoelectric plate having front and back surfaces. The back surface of the piezoelectric plate is attached to the surface of the substrate except for a portion of the piezoelectric plate forming a diaphragm that spans a cavity in the substrate. An interdigital transducer (IDT) is formed on the front surface of the piezoelectric plate such that interleaved fingers of the IDT are disposed on the diaphragm. One or more diaphragm support pedestals extend between the substrate and the diaphragm within the cavity.

20 Claims, 12 Drawing Sheets

Related U.S. Application Data which is a continuation of application No. 16/578,811, filed on Sep. 23, 2019, now Pat. No. 10,637,438, which is a continuation-in-part of application No. 16/230,433, filed on Dec. 21, 2018, now Pat. No. 10,491,192.

(60) Provisional application No. 62/904,143, filed on Sep. 23, 2019, provisional application No. 62/753,815, filed on Oct. 31, 2018, provisional application No. 62/748,883, filed on Oct. 22, 2018, provisional application No. 62/741,702, filed on Oct. 5, 2018, provisional application No. 62/701,363, filed on Jul. 20, 2018, provisional application No. 62/685,825, filed on Jun. 15, 2018.

(51) Int. Cl.
*H03H 9/02* (2006.01)
*H03H 9/13* (2006.01)

(58) Field of Classification Search
USPC .......................................................... 333/186
See application file for complete search history.

(56) References Cited

U.S. PATENT DOCUMENTS

| | | |
|---|---|---|
| 5,726,610 A | 3/1998 | Allen et al. |
| 5,853,601 A | 12/1998 | Krishaswamy |
| 6,377,140 B1 | 4/2002 | Ehara et al. |
| 6,516,503 B1 | 2/2003 | Ikada et al. |
| 6,540,827 B1 | 4/2003 | Levy et al. |
| 6,707,229 B1 | 3/2004 | Martin |
| 6,710,514 B2 | 3/2004 | Ikada et al. |
| 7,345,400 B2 | 3/2008 | Nakao et al. |
| 7,463,118 B2 | 12/2008 | Jacobsen |
| 7,535,152 B2 | 5/2009 | Ogami et al. |
| 7,684,109 B2 | 3/2010 | Godshalk et al. |
| 7,728,483 B2 | 6/2010 | Tanaka |
| 7,868,519 B2 | 1/2011 | Umeda |
| 7,941,103 B2 | 5/2011 | Iwamoto et al. |
| 8,278,802 B1 | 10/2012 | Lee et al. |
| 8,294,330 B1 | 10/2012 | Abbott et al. |
| 8,344,815 B2 | 1/2013 | Yamanaka |
| 8,816,567 B2 | 8/2014 | Zuo et al. |
| 8,829,766 B2 | 9/2014 | Milyutin et al. |
| 8,932,686 B2 | 1/2015 | Hayakawa et al. |
| 9,093,979 B2 | 7/2015 | Wang |
| 9,130,145 B2 | 9/2015 | Martin et al. |
| 9,219,466 B2 | 12/2015 | Meltaus et al. |
| 9,276,557 B1 | 3/2016 | Nordquist et al. |
| 9,369,105 B1 | 6/2016 | Li |
| 9,425,765 B2 | 8/2016 | Rinaldi |
| 9,525,398 B1 | 12/2016 | Olsson |
| 9,640,750 B2 | 5/2017 | Nakanishi et al. |
| 9,748,923 B2 | 8/2017 | Kando et al. |
| 9,762,202 B2 | 9/2017 | Thalmayr et al. |
| 9,780,759 B2 | 10/2017 | Kimura et al. |
| 9,837,984 B2 | 12/2017 | Khlat et al. |
| 10,079,414 B2 | 9/2018 | Guyette et al. |
| 10,187,039 B2 | 1/2019 | Komatsu et al. |
| 10,200,013 B2 | 2/2019 | Bower et al. |
| 10,211,806 B2 | 2/2019 | Bhattacharjee |
| 10,284,176 B1 | 5/2019 | Solal |
| 10,491,192 B1 | 11/2019 | Plesski et al. |
| 10,601,392 B2 | 3/2020 | Plesski et al. |
| 10,637,438 B2 | 4/2020 | Garcia et al. |
| 10,644,674 B2 | 5/2020 | Takamine |
| 10,756,697 B2 | 8/2020 | Plesski et al. |
| 10,790,802 B2 | 9/2020 | Yantchev et al. |
| 10,797,675 B2 | 10/2020 | Plesski |
| 10,826,462 B2 | 11/2020 | Plesski et al. |
| 10,868,512 B2 | 12/2020 | Garcia et al. |
| 10,917,070 B2 | 2/2021 | Plesski et al. |
| 2002/0079986 A1 | 6/2002 | Ruby et al. |
| 2002/0158714 A1 | 10/2002 | Kaitila et al. |
| 2002/0189062 A1 | 12/2002 | Lin et al. |
| 2003/0080831 A1 | 5/2003 | Naumenko et al. |
| 2003/0199105 A1 | 10/2003 | Kub et al. |
| 2004/0100164 A1 | 5/2004 | Murata |
| 2004/0261250 A1 | 12/2004 | Kadota et al. |
| 2005/0185026 A1 | 8/2005 | Noguchi et al. |
| 2005/0218488 A1 | 10/2005 | Matsuo |
| 2005/0264136 A1 | 12/2005 | Tsutsumi et al. |
| 2006/0179642 A1 | 8/2006 | Kawamura |
| 2007/0182510 A1 | 8/2007 | Park |
| 2007/0188047 A1 | 8/2007 | Tanaka |
| 2007/0194863 A1 | 8/2007 | Shibata et al. |
| 2007/0267942 A1 | 11/2007 | Matsumoto et al. |
| 2008/0246559 A1 | 10/2008 | Ayaz |
| 2010/0064492 A1 | 3/2010 | Tanaka |
| 2010/0123367 A1 | 5/2010 | Tai et al. |
| 2011/0018389 A1 | 1/2011 | Fukano et al. |
| 2011/0018654 A1 | 1/2011 | Bradley et al. |
| 2011/0109196 A1 | 5/2011 | Goto |
| 2011/0278993 A1 | 11/2011 | Iwamoto |
| 2012/0286900 A1 | 11/2012 | Kadota et al. |
| 2013/0234805 A1 | 9/2013 | Takahashi |
| 2013/0271238 A1 | 10/2013 | Onda |
| 2013/0278609 A1 | 10/2013 | Stephanou et al. |
| 2013/0321100 A1 | 12/2013 | Wang |
| 2014/0009032 A1* | 1/2014 | Takahashi .......... H03H 9/02228 29/25.35 |
| 2014/0130319 A1 | 5/2014 | Iwamoto |
| 2014/0145556 A1 | 5/2014 | Kadota |
| 2014/0151151 A1 | 6/2014 | Reinhardt |
| 2014/0152145 A1 | 6/2014 | Kando et al. |
| 2014/0173862 A1 | 6/2014 | Kando et al. |
| 2014/0225684 A1 | 8/2014 | Kando et al. |
| 2015/0042417 A1 | 2/2015 | Onodera et al. |
| 2015/0319537 A1 | 11/2015 | Perois et al. |
| 2015/0333730 A1 | 11/2015 | Meltaus |
| 2016/0028367 A1 | 1/2016 | Shealy |
| 2016/0182009 A1 | 6/2016 | Bhattacharjee |
| 2017/0063332 A1 | 3/2017 | Gilbert et al. |
| 2017/0179928 A1 | 6/2017 | Raihn et al. |
| 2017/0214381 A1 | 7/2017 | Bhattacharjee |
| 2017/0214387 A1 | 7/2017 | Burak et al. |
| 2017/0222617 A1 | 8/2017 | Mizoguchi |
| 2017/0222622 A1 | 8/2017 | Solal et al. |
| 2017/0370791 A1 | 12/2017 | Nakamura et al. |
| 2018/0005950 A1 | 1/2018 | Watanabe |
| 2018/0026603 A1 | 1/2018 | Iwamoto |
| 2018/0033952 A1 | 2/2018 | Yamamoto |
| 2018/0062615 A1 | 3/2018 | Kato et al. |
| 2018/0062617 A1 | 3/2018 | Yun et al. |
| 2018/0123016 A1 | 5/2018 | Gong |
| 2018/0191322 A1 | 7/2018 | Chang et al. |
| 2019/0068164 A1 | 2/2019 | Houlden et al. |
| 2019/0123721 A1 | 4/2019 | Takamine |
| 2019/0131953 A1 | 5/2019 | Gong |
| 2019/0273480 A1 | 9/2019 | Lin |
| 2019/0348966 A1 | 11/2019 | Campanella-Pineda |
| 2020/0036357 A1 | 1/2020 | Mimura |
| 2020/0235719 A1 | 7/2020 | Yantchev et al. |
| 2021/0408994 A1* | 12/2021 | Nagatomo ......... H03H 9/02897 |

OTHER PUBLICATIONS

Sorokin et al. Study of Microwave Acoustic Attenuation in a Multi-frequency Bulk Acoustic Resonator Based on a Synthetic Diamond Single Crystal Published in Acoustical Physics, vol. 61, No. 6, 2015 p. 675 (Year 2015) Jan. 2015.

Zou, Jie "High-Performance Aluminum Nitride Lamb Wave Resonators for RF Front-End Technology" University of California, Berkeley, Summer 2015, p. 63 (Year 2015) Jan. 2015.

Santosh, G., Surface acoustic wave devices on silicon using patterned and thin film ZnO, Ph.D. thesis, Feb. 2016, Indian Institute of technology Guwahati, Assam, India Feb. 2016.

Merriam Webster, dictionary meaning of the word "diaphragm", since 1828, Merriam Webster (Year: 1828) 1828.

(56) References Cited

OTHER PUBLICATIONS

Kadota et al. "5.4 Ghz Lamb Wave Resonator on LiNbO3 Thin Crystal Plate and Its Application," published in Japanese Journal of Applied Physics 50 (2011) 07HD11. (Year: 2011) 2011.
USPTO/ISA, International Search Report and Written Opinion for PCT Application No. PCT/US2020/45654 dated Oct. 29, 2020. 2020.
Safari et al. "Piezoelectric for Transducer Applications" published by Elsevier Science Ltd., p. 4 (Year: 2000). 2020.
Moussa et al. Review on Triggered Liposomal Drug Delivery with a Focus on Ultrasound 2015, Bentham Science Publishers, pp. 16 (Year 2005) 2005.
Acoustic Properties of Solids ONDA Corporation 592 Weddell Drive, Sunnyvale, CA 94089, Apr. 11, 2003, pp. 5 (Year 2003). 2003.
Bahreyni, B. Fabrication and Design of Resonant Microdevices Andrew William, Inc. 2018, NY (Year 2008). 2008.
Material Properties of Tibtech Innovations, © 2018 TIBTECH Innovations (Year 2018). 2018.
Namdeo et al. "Simulation on Effects of Electrical Loading due to Interdigital Transducers in Surface Acoustic Wave Resonator", published in Procedia Engineering 64 ( 2013) of Science Direct pp. 322-330 (Year: 2013) 2013.
Rodriguez-Madrid et al., "Super-High-Frequency SAW Resonators on AlN/Diamond", IEEE Electron Device Letters, vol. 33, No. 4, Apr. 2012, pp. 495-497. Year: 2012) 2012.
A. C. Guyette, "Theory and Design of Intrinsically Switched Multiplexers With Optimum Phase Linearity," in IEEE Transactions on Microwave Theory and Techniques, vol. 61, No. 9, pp. 3254-3264, Sep. 2013, doi: 10.1109/TMTT.2013.2274963. Sep. 2013.
Yanson Yang, Ruochen Lu, Songbin Gong, High Q Antisymmetric Mode Lithium Niobate MEMS Resonators With Spurious Mitigation, Journal of Microelectromechanical Systems, vol. 29, No. 2, Apr. 2020. Apr. 2, 2020.
Yu-Po Wong, Luyan Qiu, Naoto Matsuoka, Ken-ya Hashimoto, Broadband Piston Mode Operation for First-order Antisymmetric Mode Resonators, 2020 IEEE International Ultrasonics Symposium, Sep. 2020. Sep. 2020.
T. Takai, H. Iwamoto, et al., "I.H.P. Saw Technology and its Application to Microacoustic Components (Invited)." 2017 IEEE International Ultrasonics Symposium, Sep. 6-9, 2017. pp. 1-8.
R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190.
M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.
Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.
Y. Yang, A. Gao et al. "5 GHZ Lithium Niobate MEMS Resonators With High FOM of 153", 2017 IEEE 30th International Conference in Micro Electro Mechanical Systems (MEMS). Jan. 22-26, 2017 pp. 942-945.
USPTO/ISA, International Search Report and Written Opinion for PCT Application No. PCT/US2019/036433 dated Aug. 29, 2019.
USPTO/ISA, International Search Report and Written Opinion for PCT Application No. PCT/US2019/058632 dated Jan. 17, 2020.
G. Manohar, "Investigation of Various Surface Acoustic Wave Design Configurations for Improved Sensitivity." Doctoral dissertation, University of South Florida, USA, Jan. 2012, 7 pages.
Ekeom, D. & Dubus, Bertrand & Volatier, A.. (2006). Solidly mounted resonator (SMR) FEM-BEM simulation. 1474-1477. 10.1109/ULTSYM.2006.371.
Mizutaui, K. and Toda, K., "Analysis of lamb wave propagation characteristics in rotated Y-cut X-propagation LiNbO3 plates." Electron. Comm. Jpn. Pt. I, 69, No. 4 (1986): 47-55. doi:10.1002/ecja.4410690406.
Naumenko et al., "Optimal orientations of Lithium Niobate for resonator SAW filters", 2003 IEEE Ultrasonics Symposium—pp. 2110-2113. (Year: 2003).

\* cited by examiner

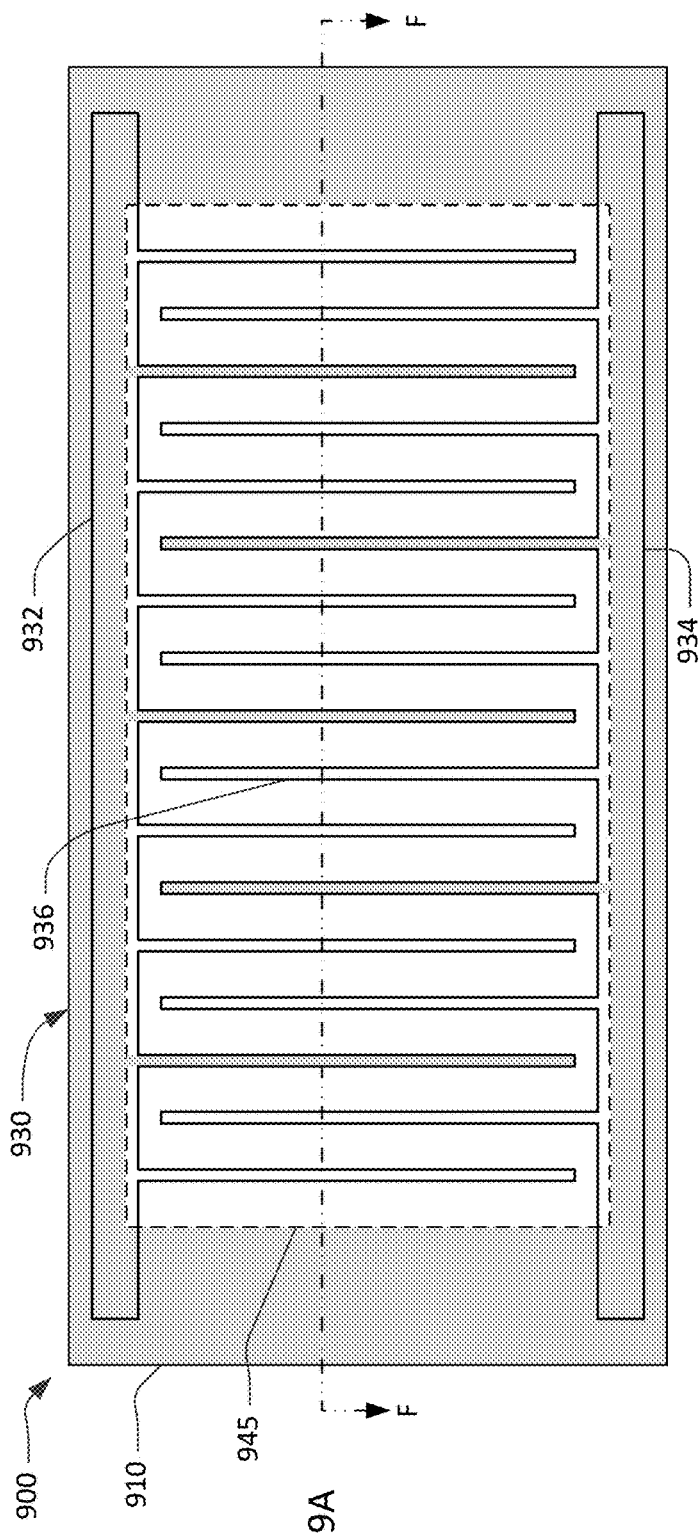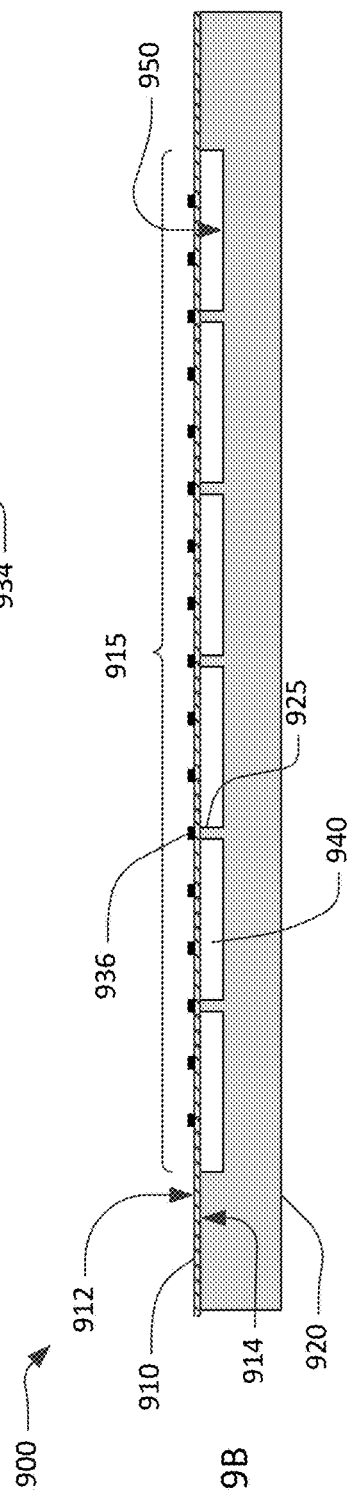

TRANSVERSELY-EXCITED FILM BULK ACOUSTIC RESONATOR WITH DIAPHRAGM SUPPORT PEDESTALS

RELATED APPLICATION INFORMATION

This patent claims priority from provisional patent application 62/904,143, filed Sep. 23, 2019, entitled XBAR RESONATOR WITH SI SUPPORT UNDER IDT METAL. This patent is a continuation-in-part of application Ser. No. 16/829,617, entitled HIGH POWER TRANSVERSELY-EXCITED FILM BULK ACOUSTIC RESONATORS ON Z-CUT LITHIUM NIOBATE, filed Mar. 25, 2020, which is a continuation of application Ser. No. 16/578,811, entitled TRANSVERSELY-EXCITED FILM BULK ACOUSTIC RESONATORS FOR HIGH POWER APPLICATIONS, filed Sep. 23, 2019, now U.S. Pat. No. 10,637,438. which is a continuation-in-part of application Ser. No. 16/230,443, entitled TRANSVERSELY-EXCITED FILM BULK ACOUSTIC RESONATOR, filed Dec. 21, 2018, now U.S. Pat. No. 10,491,192, which claims priority from the following provisional patent applications: application 62/685,825, filed Jun. 15, 2018, entitled SHEAR-MODE FBAR (XBAR); application 62/701,363, filed Jul. 20, 2018, entitled SHEAR-MODE FBAR (XBAR); application 62/741,702, filed Oct. 5, 2018, entitled 5 GHZ LATERALLY-EXCITED BULK WAVE RESONATOR (XBAR); application 62/748,883, filed Oct. 22, 2018, entitled SHEAR-MODE FILM BULK ACOUSTIC RESONATOR; and application 62/753,815, filed Oct. 31, 2018, entitled LITHIUM TANTALATE SHEAR-MODE FILM BULK ACOUSTIC RESONATOR. All of these applications are incorporated herein by reference.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a passband or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

The desire for wider communication channel bandwidths will inevitably lead to the use of higher frequency communications bands. The current LTE™ (Long Term Evolution) specification defines frequency bands from 3.3 GHz to 5.9 GHz. These bands are not presently used. Future proposals for wireless communications include millimeter wave communication bands with frequencies up to 28 GHz.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies proposed for future communications networks.

DESCRIPTION OF THE DRAWINGS

FIG. 9A is a schematic plan view of another XBAR with diaphragm support pedestals.

FIG. 9B is a schematic cross-sectional view of the XBAR with diaphragm support pedestals of FIG. 9A.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Description of Apparatus

Figure 1:
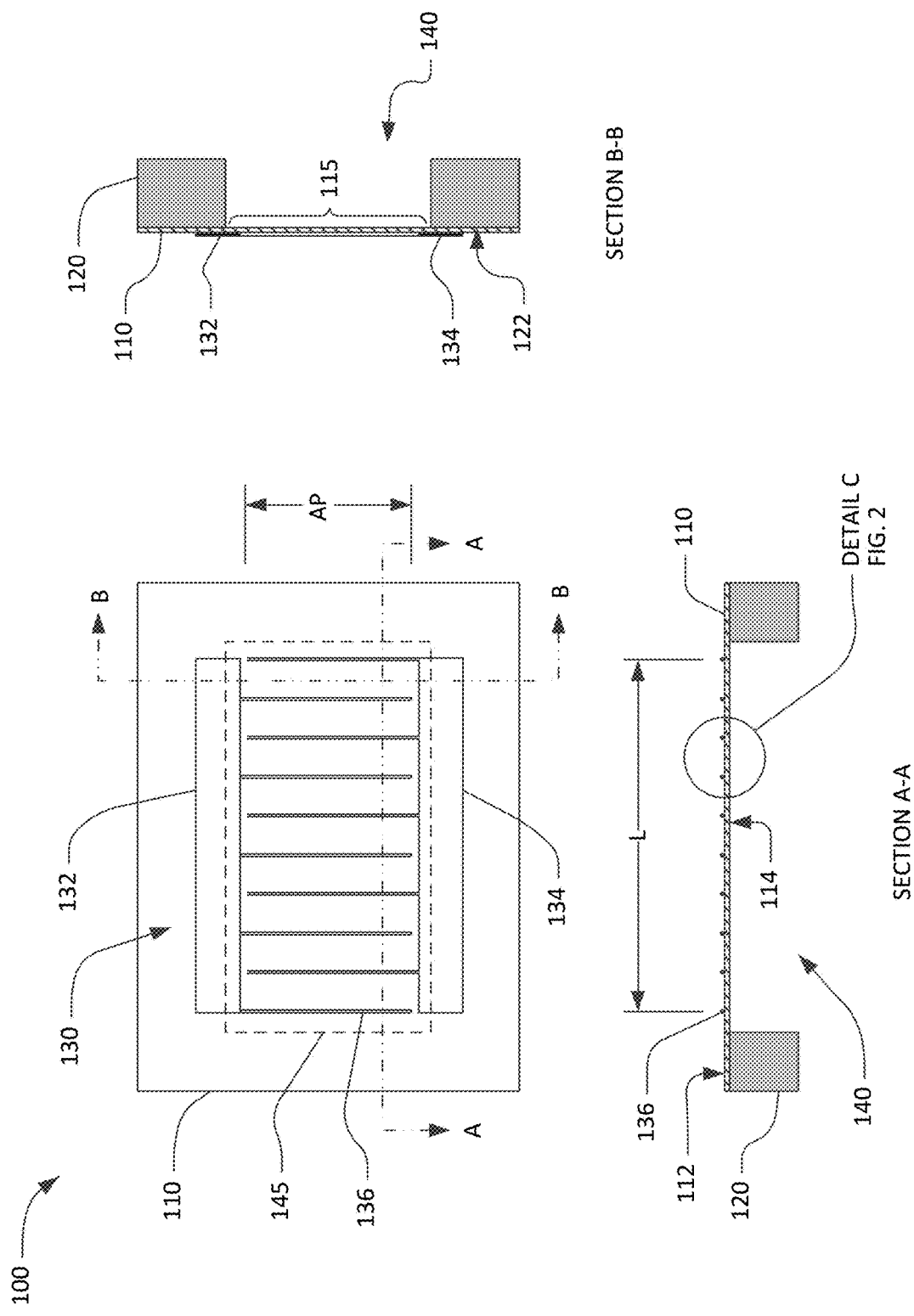
FIG. 1 is a schematic plan view and two schematic cross-sectional views of a transversely-excited film bulk acoustic resonator (XBAR).

FIG. 1 shows a simplified schematic top view and orthogonal cross-sectional views of a transversely-excited film bulk acoustic resonator (XBAR) 100. XBAR resonators such as the resonator 100 may be used in a variety of RF filters including band-reject filters, band-pass filters, duplexers, and multiplexers. XBARs are well suited for use in filters for communications bands with frequencies above 3 GHz.

The XBAR 100 is made up of a thin film conductor pattern formed on a surface of a piezoelectric plate 110 having a front surface 112 and a back surface 114. The front and back surfaces are essentially parallel. "Essentially parallel" means parallel to the extent possible within normal manufacturing tolerances. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. In the examples presented in this patent, the piezoelectric plates are Z-cut, which is to say the Z axis is normal to the front surface 112 and back surface 114. However, XBARs may be fabricated on piezoelectric plates with other crystallographic orientations including rotated Z-cut and rotated YX-cut.

The back surface 114 of the piezoelectric plate 110 is attached to a surface 122 of the substrate 120 except for a portion of the piezoelectric plate 110 that forms a diaphragm 115 spanning a cavity 140 formed in the substrate 120. The portion of the piezoelectric plate that spans the cavity is referred to herein as the "diaphragm" due to its physical resemblance to the diaphragm of a microphone. As shown in FIG. 1, the diaphragm 115 is contiguous with the rest of the piezoelectric plate 110 around all of a perimeter 145 of the cavity 140. In this context, "contiguous" means "continuously connected without any intervening item".

The substrate 120 provides mechanical support to the piezoelectric plate 110. The substrate 120 may be, for example, silicon, sapphire, quartz, or some other material or combination of materials. The back surface 114 of the piezoelectric plate 110 may be attached to the substrate 120 using a wafer bonding process. Alternatively, the piezoelectric plate 110 may be grown on the substrate 120 or otherwise attached to the substrate. The piezoelectric plate 110 may be attached directly to the substrate or may be attached to the substrate 120 via one or more intermediate material layers.

The cavity 140 is an empty space within a solid body of the resonator 100. The cavity 140 may be a hole completely through the substrate 120 (as shown in Section A-A and Section B-B) or a recess in the substrate 120 (as shown subsequently in FIG. 3). The cavity 140 may be formed, for example, by selective etching of the substrate 120 before or after the piezoelectric plate 110 and the substrate 120 are attached.

The conductor pattern of the XBAR 100 includes an interdigital transducer (IDT) 130. An IDT is an electrode structure for converting between electrical and acoustic energy in piezoelectric devices. The IDT 130 includes a first plurality of parallel elongated conductors, commonly called "fingers", such as finger 136, extending from a first busbar 132. The IDT 130 includes a second plurality of fingers extending from a second busbar 134. The first and second pluralities of parallel fingers are interleaved. The interleaved fingers overlap for a distance AP, commonly referred to as the "aperture" of the IDT. The center-to-center distance L between the outermost fingers of the IDT 130 is the "length" of the IDT.

The term "busbar" refers to the conductors that interconnect the first and second sets of fingers in an IDT. As shown in FIG. 1, each busbar 132, 134 is an elongated rectangular conductor with a long axis orthogonal to the interleaved fingers and having a length approximately equal to the length L of the IDT. The busbars of an IDT need not be rectangular or orthogonal to the interleaved fingers and may have lengths longer than the length of the IDT.

The first and second busbars 132, 134 serve as the terminals of the XBAR 100. A radio frequency or microwave signal applied between the two busbars 132, 134 of the IDT 130 excites a primary acoustic mode within the piezoelectric plate 110. As will be discussed in further detail, the primary acoustic mode is a bulk shear mode where acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator.

The IDT 130 is positioned on the piezoelectric plate 110 such that at least the fingers of the IDT 130 are disposed on the diaphragm 115 of the piezoelectric plate that spans, or is suspended over, the cavity 140. As shown in FIG. 1, the cavity 140 has a rectangular shape with an extent greater than the aperture AP and length L of the IDT 130. A cavity of an XBAR may have a different shape, such as a regular or irregular polygon. The cavity of an XBAR may more or fewer than four sides, which may be straight or curved.

For ease of presentation in FIG. 1, the geometric pitch and width of the IDT fingers is greatly exaggerated with respect to the length (dimension L) and aperture (dimension AP) of the XBAR. An XBAR for a 5G device will have more than ten parallel fingers in the IDT 110. An XBAR may have hundreds, possibly thousands, of parallel fingers in the IDT 110. Similarly, the thickness of the fingers in the cross-sectional views is greatly exaggerated in the drawings.

Figure 2:
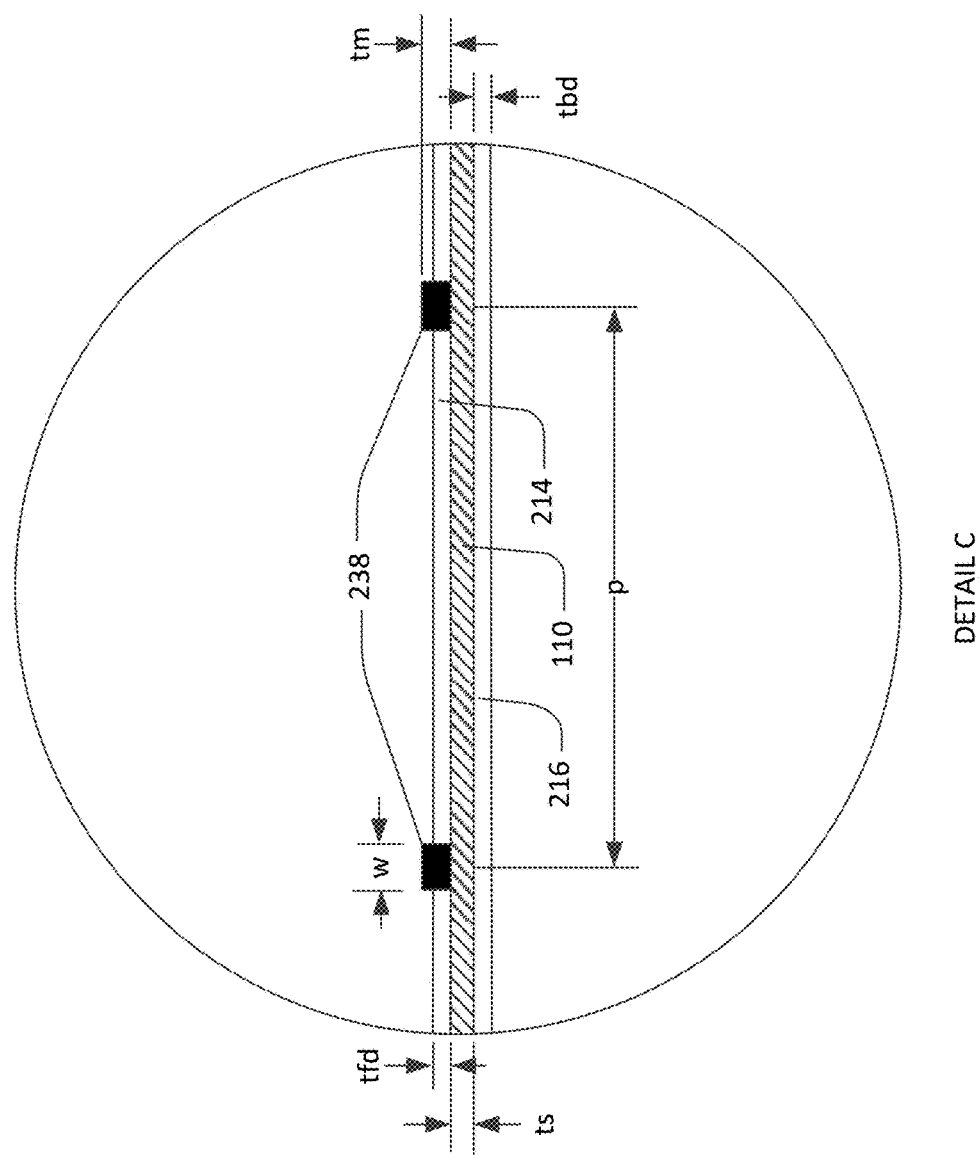
FIG. 2 is an expanded schematic cross-sectional view of a portion of the XBAR of FIG. 1.

FIG. 2 shows a detailed schematic cross-sectional view of the XBAR 100. The piezoelectric plate 110 is a single-crystal layer of piezoelectrical material having a thickness ts.

ts may be, for example, 100 nm to 1500 nm. When used in filters for LTE™ bands from 3.4 GHZ to 6 GHz (e.g. bands 42, 43, 46), the thickness ts may be, for example, 200 nm to 1000 nm.

A front-side dielectric layer 214 may be formed on the front side of the piezoelectric plate 110. The "front side" of the XBAR is the surface facing away from the substrate. The front-side dielectric layer 214 has a thickness tfd. The front-side dielectric layer 214 is formed between the IDT fingers 238. Although not shown in FIG. 2, the front side dielectric layer 214 may also be deposited over the IDT fingers 238. A back-side dielectric layer 216 may be formed on the back side of the piezoelectric plate 110. The back-side dielectric layer 216 has a thickness tbd. The front-side and back-side dielectric layers 214, 216 may be a non-piezoelectric dielectric material, such as silicon dioxide or silicon nitride. tfd and tbd may be, for example, 0 to 500 nm. tfd and tbd are typically less than the thickness ts of the piezoelectric plate. tfd and tbd are not necessarily equal, and the front-side and back-side dielectric layers 214, 216 are not necessarily the same material. Either or both of the front-side and back-side dielectric layers 214, 216 may be formed of multiple layers of two or more materials.

The IDT fingers 238 may be one or more layers of aluminum, a substantially aluminum alloy, copper, a substantially copper alloy, beryllium, gold, molybdenum, or some other conductive material. Thin (relative to the total thickness of the conductors) layers of other metals, such as chromium or titanium, may be formed under and/or over the fingers to improve adhesion between the fingers and the piezoelectric plate 110 and/or to passivate or encapsulate the fingers. The busbars (132, 134 in FIG. 1) of the IDT may be made of the same or different materials as the fingers. As shown in FIG. 2, the IDT fingers 238 have rectangular cross-sections. The IDT fingers may have some other cross-sectional shape, such as trapezoidal.

Dimension p is the center-to-center spacing or "pitch" of the IDT fingers, which may be referred to as the pitch of the IDT and/or the pitch of the XBAR. Dimension w is the width or "mark" of the IDT fingers. The IDT of an XBAR differs substantially from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e., the mark or finger width is about one-fourth of the acoustic wavelength at resonance). In an XBAR, the pitch p of the IDT is typically 2 to 20 times the width w of the fingers. In addition, the pitch p of the IDT is typically 2 to 20 times the thickness ts of the piezoelectric slab 212. The width of the IDT fingers in an XBAR is not constrained to one-fourth of the acoustic wavelength at resonance. For example, the width of XBAR IDT fingers may be 500 nm or greater, such that the IDT can be fabricated using optical lithography. The thickness tm of the IDT fingers may be from 100 nm to about equal to the width w. The thickness of the busbars (132, 134 in FIG. 1) of the IDT may be the same as, or greater than, the thickness tm of the IDT fingers.

Figure 3:
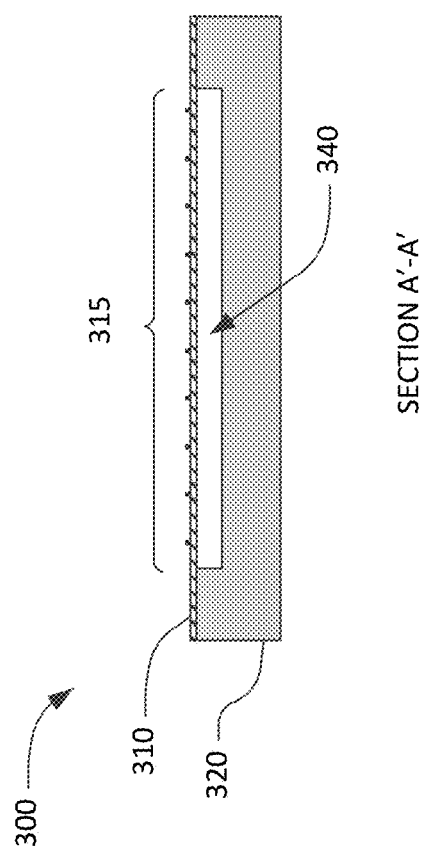
FIG. 3 is an alternative schematic cross-sectional view of the XBAR of FIG. 1.

FIG. 3 is an alternative cross-sectional view along the section plane A-A defined in FIG. 1. In FIG. 3, a piezoelectric plate 310 is attached to a substrate 320. A portion of the piezoelectric plate 310 forms a diaphragm 315 spanning a cavity 340 in the substrate. The cavity 340 does not fully penetrate the substrate 320. Fingers of an IDT are disposed on the diaphragm 315. The cavity 340 may be formed, for example, by etching the substrate 320 before attaching the piezoelectric plate 310. Alternatively, the cavity 340 may be formed by etching the substrate 320 with a selective etchant that reaches the substrate through one or more openings (not shown) provided in the piezoelectric plate 310. In this case, the diaphragm 315 may be contiguous with the rest of the piezoelectric plate 310 around a large portion of a perimeter 345 of the cavity 340. For example, the diaphragm 315 may be contiguous with the rest of the piezoelectric plate 310 around at least 50% of the perimeter 345 of the cavity 340.

Figure 4:
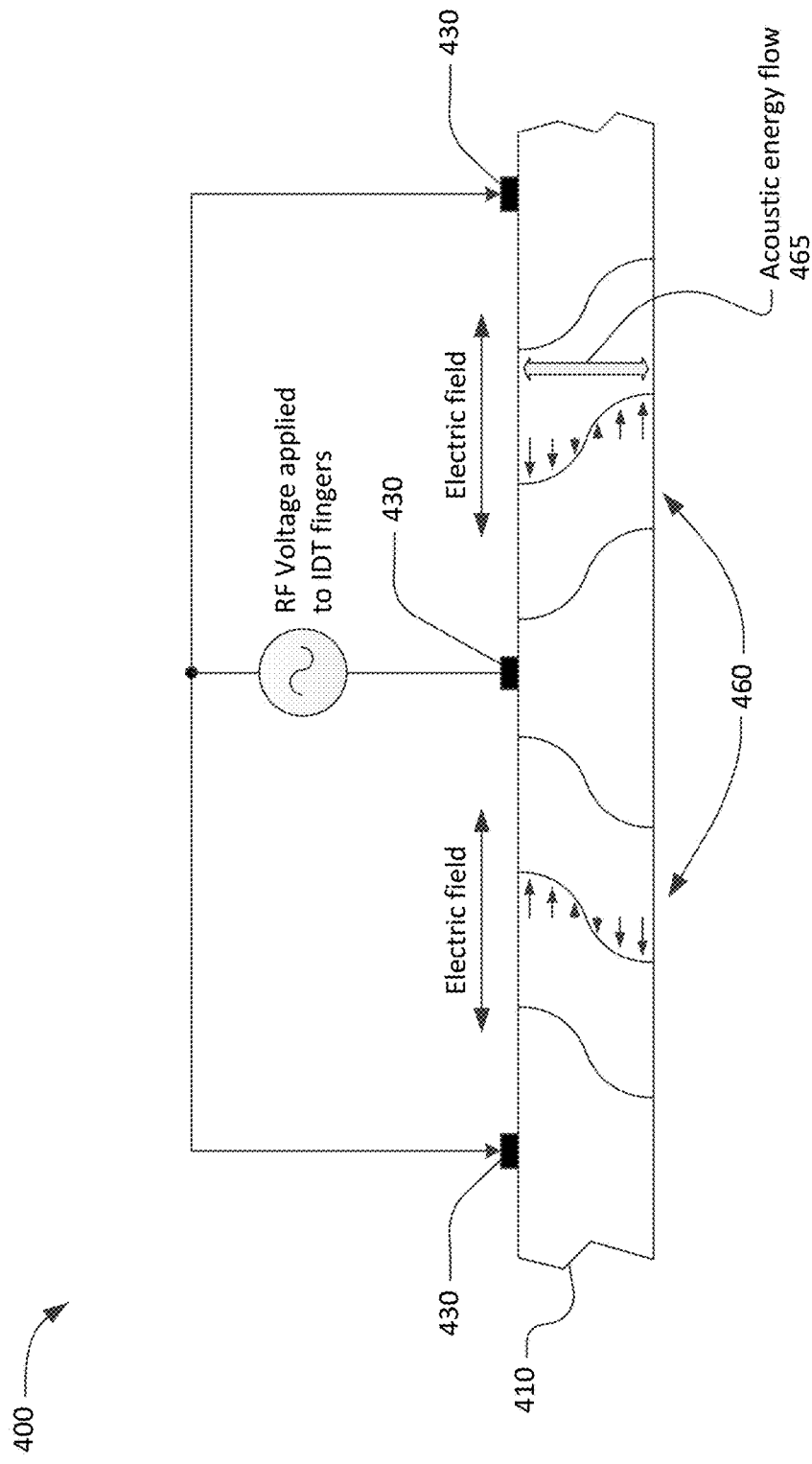
FIG. 4 is a graphic illustrating a shear primary acoustic mode in an XBAR.

FIG. 4 is a graphical illustration of the primary acoustic mode of interest in an XBAR. FIG. 4 shows a small portion of an XBAR 400 including a piezoelectric plate 410 and three interleaved IDT fingers 430. A radio frequency (RF) voltage is applied to the interleaved fingers 430. This voltage creates a time-varying electric field between the fingers. The direction of the electric field is primarily lateral, or parallel to the surface of the piezoelectric plate 410, as indicated by the arrows labeled "electric field". Since the dielectric constant of the piezoelectric plate is significantly higher than the surrounding air, the electric field is highly concentrated in the plate relative to the air. The lateral electric field introduces shear deformation, and thus strongly excites a shear-mode acoustic mode, in the piezoelectric plate 410. Shear deformation is deformation in which parallel planes in a material remain parallel and maintain a constant distance while translating relative to each other. A "shear acoustic mode" is an acoustic vibration mode in a medium that results in shear deformation of the medium. The shear deformations in the XBAR 400 are represented by the curves 460, with the adjacent small arrows providing a schematic indication of the direction and magnitude of atomic motion. The degree of atomic motion, as well as the thickness of the piezoelectric plate 410, have been greatly exaggerated for ease of visualization. While the atomic motions are predominantly lateral (i.e. horizontal as shown in FIG. 4), the direction of acoustic energy flow of the excited primary shear acoustic mode is substantially orthogonal to the surface of the piezoelectric plate, as indicated by the arrow 465.

An acoustic resonator based on shear acoustic wave resonances can achieve better performance than current state-of-the art film-bulk-acoustic-resonators (FBAR) and solidly-mounted-resonator bulk-acoustic-wave (SMR BAW) devices where the electric field is applied in the thickness direction. In such devices, the acoustic mode is compressive with atomic motions and the direction of acoustic energy flow in the thickness direction. In addition, piezoelectric coupling for shear wave XBAR resonances can be high (>20%) compared to other acoustic resonators. High piezoelectric coupling enables the design and implementation of microwave and millimeter-wave filters with appreciable bandwidth.

Figure 5:
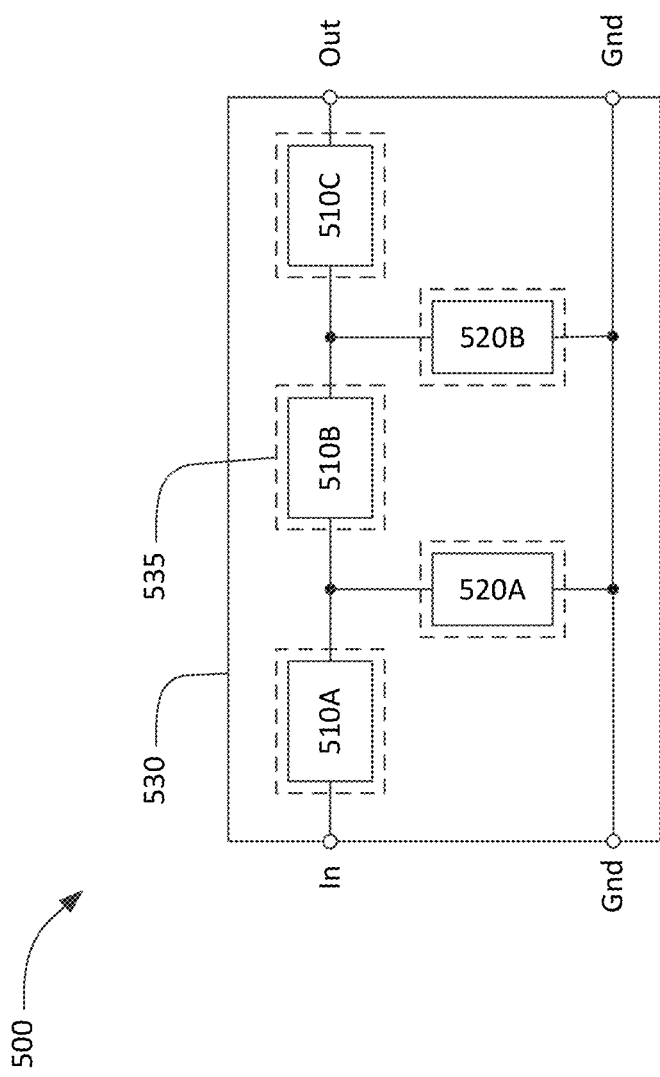
FIG. 5 is a schematic block diagram of a filter using XBARs.

FIG. 5 is a schematic circuit diagram and layout for a high frequency band-pass filter 500 using XBARs. The filter 500 has a conventional ladder filter architecture including three series resonators 510A, 510B, 510C and two shunt resonators 520A, 520B. The three series resonators 510A, 510B, and 510C are connected in series between a first port and a second port (hence the term "series resonator"). In FIG. 5, the first and second ports are labeled "In" and "Out", respectively. However, the filter 500 is bidirectional and either port may serve as the input or output of the filter. The two shunt resonators 520A, 520B are connected from nodes between the series resonators to ground. A filter may contain additional reactive components, such as inductors, not shown in FIG. 5. All the shunt resonators and series resonators are XBARs. The inclusion of three series and two shunt resonators is exemplary. A filter may have more or fewer than five total resonators, more or fewer than three series resonators, and more or fewer than two shunt resonators. Typically, all of the series resonators are connected in series between an input and an output of the filter. All of the shunt resonators are typically connected between ground and the input, the output, or a node between two series resonators.

In the exemplary filter 500, the three series resonators 510A, B, C and the two shunt resonators 520A, B of the filter 500 are formed on a single plate 530 of piezoelectric material bonded to a silicon substrate (not visible). Each resonator includes a respective IDT (not shown), with at least the fingers of the IDT disposed over a cavity in the substrate. In this and similar contexts, the term "respective" means "relating things each to each", which is to say with a one-to-one correspondence. In FIG. 5, the cavities are illustrated schematically as the dashed rectangles (such as the rectangle 535). In this example, each IDT is disposed over a respective cavity. In other filters, the IDTs of two or more resonators may be disposed over a single cavity.

Each of the resonators 510A, 510B, 510C, 520A, 520B in the filter 500 has resonance where the admittance of the resonator is very high and an anti-resonance where the admittance of the resonator is very low. The resonance and anti-resonance occur at a resonance frequency and an anti-resonance frequency, respectively, which may be the same or different for the various resonators in the filter 500. In over-simplified terms, each resonator can be considered a short-circuit at its resonance frequency and an open circuit at its anti-resonance frequency. The input-output transfer function will be near zero at the resonance frequencies of the shunt resonators and at the anti-resonance frequencies of the series resonators. In a typical filter, the resonance frequencies of the shunt resonators are positioned below the lower edge of the filter's passband and the anti-resonance frequencies of the series resonators are position above the upper edge of the passband.

Figure 6:
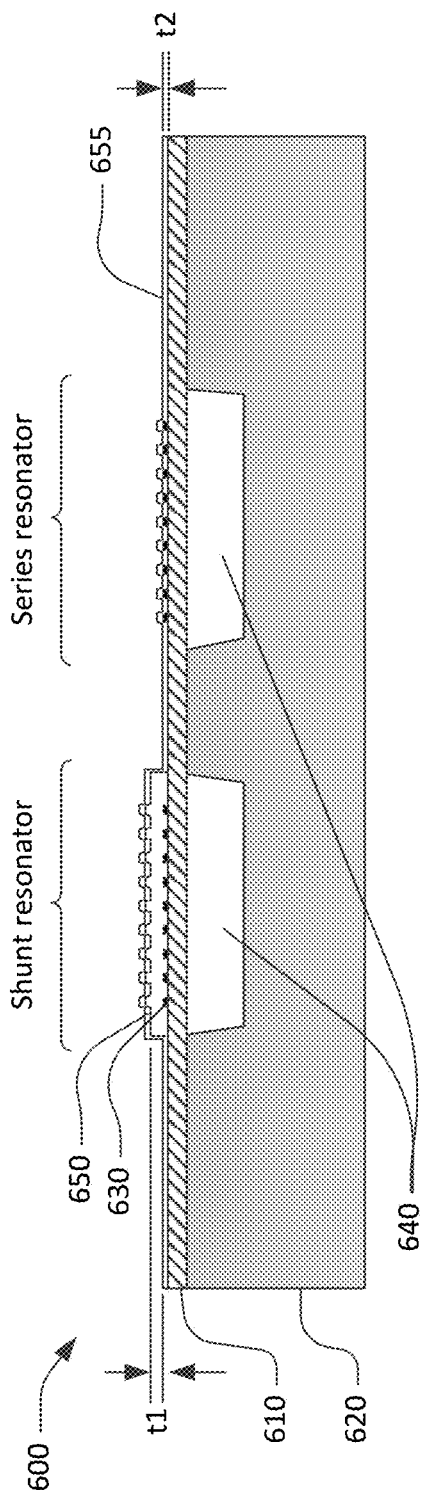
FIG. 6 is a schematic cross-sectional view of two XBARs illustrating a frequency-setting dielectric layer.

FIG. 6 is a schematic cross-sectional view through a shunt resonator and a series resonator of a filter 600 that uses a dielectric frequency setting layer to separate the resonance frequencies of shunt and series resonators. A piezoelectric plate 610 is attached to a substrate 620. Portions of the piezoelectric plate 610 form diaphragms spanning cavities 640 in the substrate 620. Interleaved IDT fingers, such as finger 630, are formed on the diaphragms. A first dielectric layer 650, having a thickness t1, is formed over the IDT of the shunt resonator. The first dielectric layer 650 is considered a "frequency setting layer", which is a layer of dielectric material applied to a first subset of the resonators in a filter to offset the resonance frequencies of the first subset of resonators with respect to the resonance frequencies of resonators that do not receive the dielectric frequency setting layer. The dielectric frequency setting layer is commonly $SiO_2$ but may be silicon nitride, aluminum oxide, or some other dielectric material. The dielectric frequency setting layer may be a laminate or composite of two or more dielectric materials.

A second dielectric layer 655, having a thickness t2, may be deposited over both the shunt and series resonator. The second dielectric layer 655 serves to seal and passivate the surface of the filter 600. The second dielectric layer may be the same material as the first dielectric layer or a different material. The second dielectric layer may be a laminate or composite of two or more different dielectric materials. Further, as will be described subsequently, the thickness of the second dielectric layer may be locally adjusted to fine-tune the frequency of the filter 600A. Thus, the second dielectric layer can be referred to as the "passivation and tuning layer".

The resonance frequency of an XBAR is roughly proportional to the inverse of the total thickness of the diaphragm including the piezoelectric plate 610 and the dielectric layers 650, 655. The diaphragm of the shunt resonator is thicker than the diaphragm of the series resonator by the thickness t1 of the dielectric frequency setting layer 650. Thus, the shunt resonator will have a lower resonance frequency than the series resonator. The difference in resonance frequency between series and shunt resonators is determined by the thickness t1.

Figure 7A:
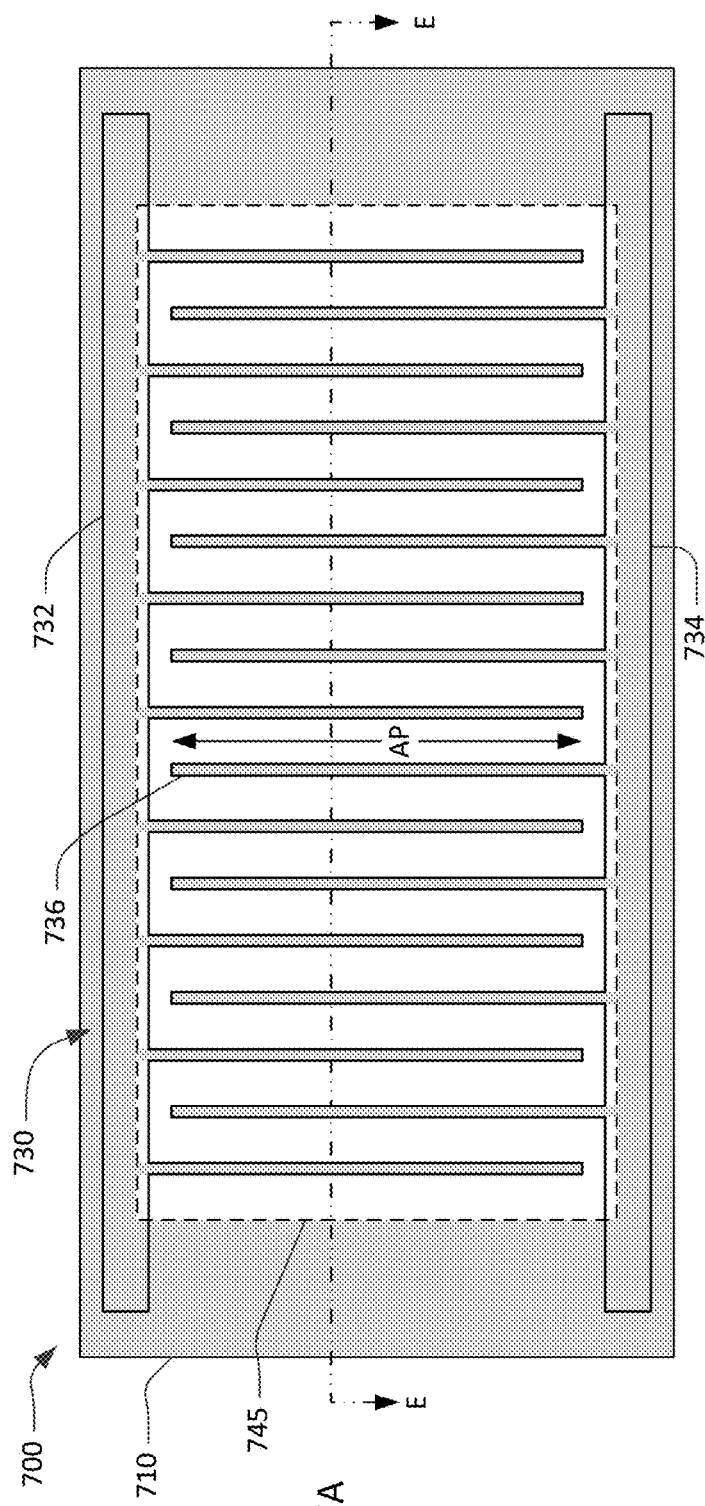
FIG. 7A is a schematic plan view of an XBAR with diaphragm support pedestals.
Figure 7B:
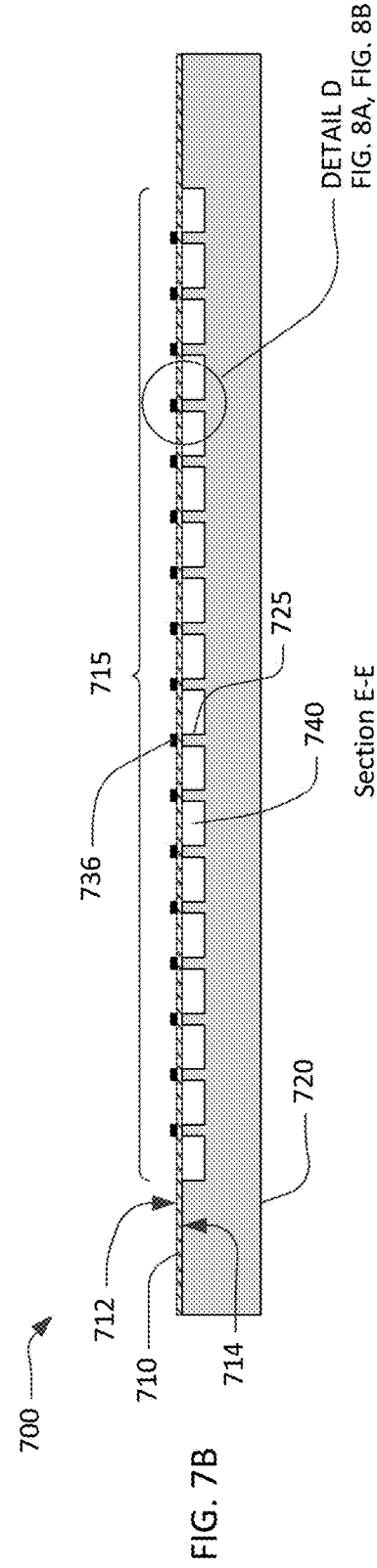
FIG. 7B is a schematic cross-sectional view of the XBAR with diaphragm support pedestals of FIG. 7A.

FIG. 7A is a schematic plan view and FIG. 7B is a cross-sectional view of an XBAR 700 with diaphragm support pedestals. Referring to FIG. 7A, the XBAR 700 includes an IDT 730 formed on a front surface (712 in FIG. 7B) of a piezoelectric plate 710. The dashed line 745 is the perimeter of a cavity (740 in FIG. 7B) formed in a substrate (720 in FIG. 7B) behind the piezoelectric plate. A portion of the piezoelectric plate 710 over the cavity 745 (i.e. within the dashed rectangle) forms a diaphragm (715 in FIG. 7B) suspended over the cavity. The IDT 730 includes a first bus bar 732, a second bus bar 734, and a plurality of interleaved fingers, such as finger 736, extending alternately from the first and second bus bars 732, 734. The interleaved fingers are disposed on the diaphragm. Shaded areas indicate where the piezoelectric plate is supported by the substrate (720 in FIG. 7B) or by diaphragm support pedestals extending from the substrate. "Pedestal" has its normal meaning of "a supporting part". A "diaphragm support pedestal" is a part that extends between a substrate and a diaphragm to provide support to the diaphragm.

FIG. 7B is a cross-sectional view of the XBAR 700 at a section plane E-E defined in FIG. 7A. The piezoelectric plate 710 has a front surface 712 and a back surface 714. The back surface 714 is attached to the substrate 720. A portion of the piezoelectric plate 710 forms a diaphragm 715 spanning the cavity 740 in the substrate 720. A conductor pattern including an IDT (730 in FIG. 7A) is formed on the front surface 712 of the piezoelectric plate. Interleaved fingers of the IDT, such as finger 736, are disposed on the diaphragm 715.

A plurality of diaphragm support pedestals, such as diaphragm support pedestal 725, connect the diaphragm 715 to the substrate 720 within the cavity 740. Each support pedestal is aligned with a finger of the IDT 730, which is to say each diaphragm support pedestal contacts the back side 714 of the piezoelectric plate in an area immediately opposite a respective IDT finger. When an RF signal is applied to the IDT 730, an electric field is formed between the IDT fingers. The magnitude of the electric field, and thus the atomic motion in the piezoelectric plate 710, is relatively low beneath each IDT finger. Aligning the diaphragm support pedestals with IDT fingers may minimize the acoustic energy coupled through the diaphragm support pedestals to the substrate 720.

In the example of FIG. 7A and FIG. 7B, the diaphragm support pedestals are ribs extending across the aperture AP of the XBAR along the length of all of the IDT fingers.

Figure 8B:
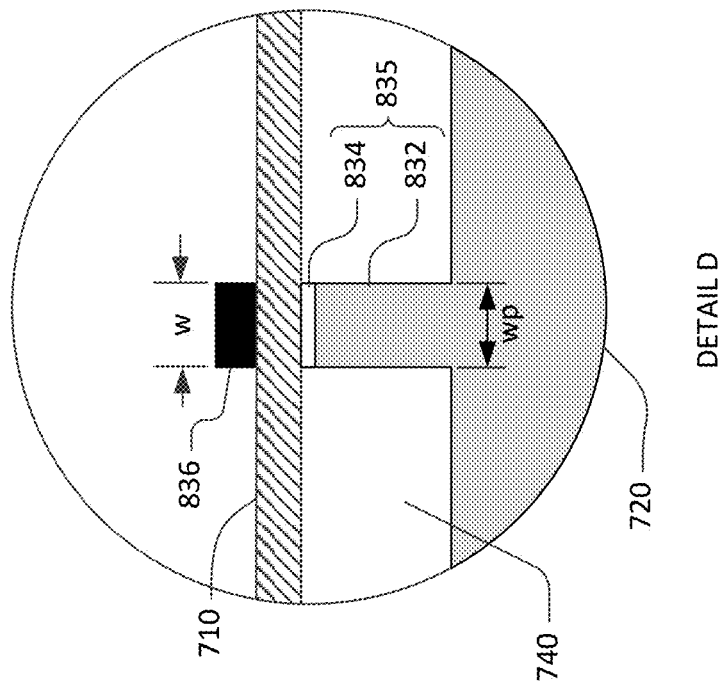
FIG. 8B is an alternative detailed schematic cross-sectional view of an XBAR with diaphragm support pedestals.
Figure 8A:
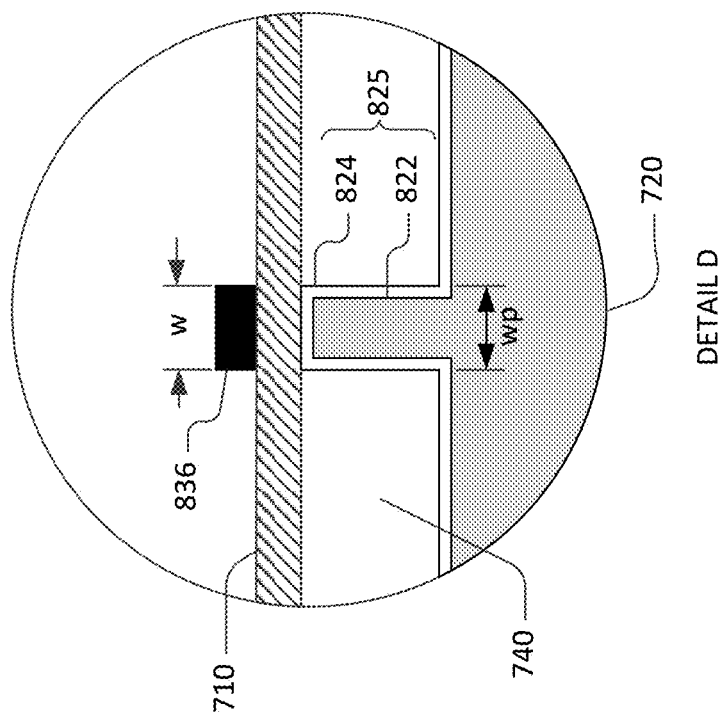
FIG. 8A is a detailed schematic cross-sectional view of an XBAR with diaphragm support pedestals.

FIG. 8A is a detailed cross-sectional view of a diaphragm support pedestal 825 that provides support to a piezoelectric plate 710. The diaphragm support pedestal 825 is aligned with an IDT finger 836. A width wp of the diaphragm support pedestal 825 is less than or equal to a width w of the IDT finger 836.

The diaphragm support pedestal 825 includes a core 822 that extends from a substrate 720. The core 822 may be the same material as the substrate 720. The core 822 may be a portion of substrate 720 that remained after the cavity 740 was etched into the substrate 720. The core 822 may be a different material from the substrate 720.

The diaphragm support pedestal 825 also includes a bonding layer 824 that covers the core 822 and the substrate 720. The bonding layer is a material capable of bonding with the piezoelectric plate 710 using a wafer bonding process. When the substrate 720 is silicon, the bonding layer 824 may be silicon dioxide, aluminum oxide, another metal oxide, or some other material capable of bonding with the piezoelectric plate 710.

FIG. 8B is a detailed cross-sectional view of another diaphragm support pedestal 835 that provides support to a piezoelectric plate 710. The diaphragm support pedestal 835 is aligned with an IDT finger 836. A width wp of the diaphragm support pedestal 835 is less than or equal to a width w of the IDT finger 836.

The diaphragm support pedestal 835 includes a base 832 that extends from a substrate 720. The base 832 may be the same material as the substrate 720. The base 832 may be a portion of substrate 720 that remained after the cavity 740 was etched into the substrate 720. The base 832 may be a different material from the substrate 720.

The diaphragm support pedestal 835 also includes a bonding layer 834 that covers at least the top of core 832 between the core 832 and the piezoelectric plate 710. The bonding layer 834 is a material capable of bonding with the piezoelectric plate 710 using a wafer bonding process. When the substrate 720 is silicon, the bonding layer 834 may be silicon dioxide, aluminum oxide, another metal oxide, or some other material capable of bonding with the piezoelectric plate 710.

FIG. 9A is a schematic plan view and FIG. 9B is a cross-sectional view of an XBAR 900 with diaphragm support pedestals. Referring to FIG. 9A, the XBAR 900 includes an IDT 930 formed on a front surface (912 in FIG. 9B) of a piezoelectric plate 910. The dashed line 945 is the perimeter of a cavity (940 in FIG. 9B) formed in a substrate (920 in FIG. 9B) behind the piezoelectric plate. A portion of the piezoelectric plate 910 within the dashed rectangle 945 forms a diaphragm suspended over the cavity. The IDT 930 includes a first bus bar 932, a second bus bar 934, and a plurality of interleaved fingers, such as finger 936, extending alternately from the first and second bus bars 932, 934. The interleaved fingers are disposed on the diaphragm. Shaded areas indicate where the piezoelectric plate is supported by the substrate (920 in FIG. 9B) or by diaphragm support pedestals extending from the substrate.

FIG. 9B is a cross-sectional view of the XBAR 900 at a section plane F-F defined in FIG. 9A. The piezoelectric plate 910 has a front surface 912 and a back surface 914. The back surface 914 is attached to the substrate 920. A portion of the piezoelectric plate 910 forms the diaphragm 915 spanning the cavity 940 in the substrate 920. A conductor pattern including the IDT 930 is formed on the front surface 912 of the piezoelectric plate. Interleaved fingers of the IDT, such as finger 936, are disposed on the diaphragm 915.

A plurality of diaphragm support pedestals, such as diaphragm support pedestal 925, connect the diaphragm 915 to the substrate 920 within the cavity 940. Each support pedestal is aligned with a finger of the IDT 930, which is to say the diaphragm support pedestal contacts the back side 914 of the piezoelectric plate in an area immediately opposite a respective IDT finger. In the example of FIG. 9A and FIG. 9B, the diaphragm support pedestals are ribs that extend across the cavity 940 under every third IDT finger. Placing a support pedestal under every third IDT finger is exemplary. A diaphragm support pedestal may be aligned with every n'th IDT finger, where n is an integer between 2 and 20.

Figure 10:
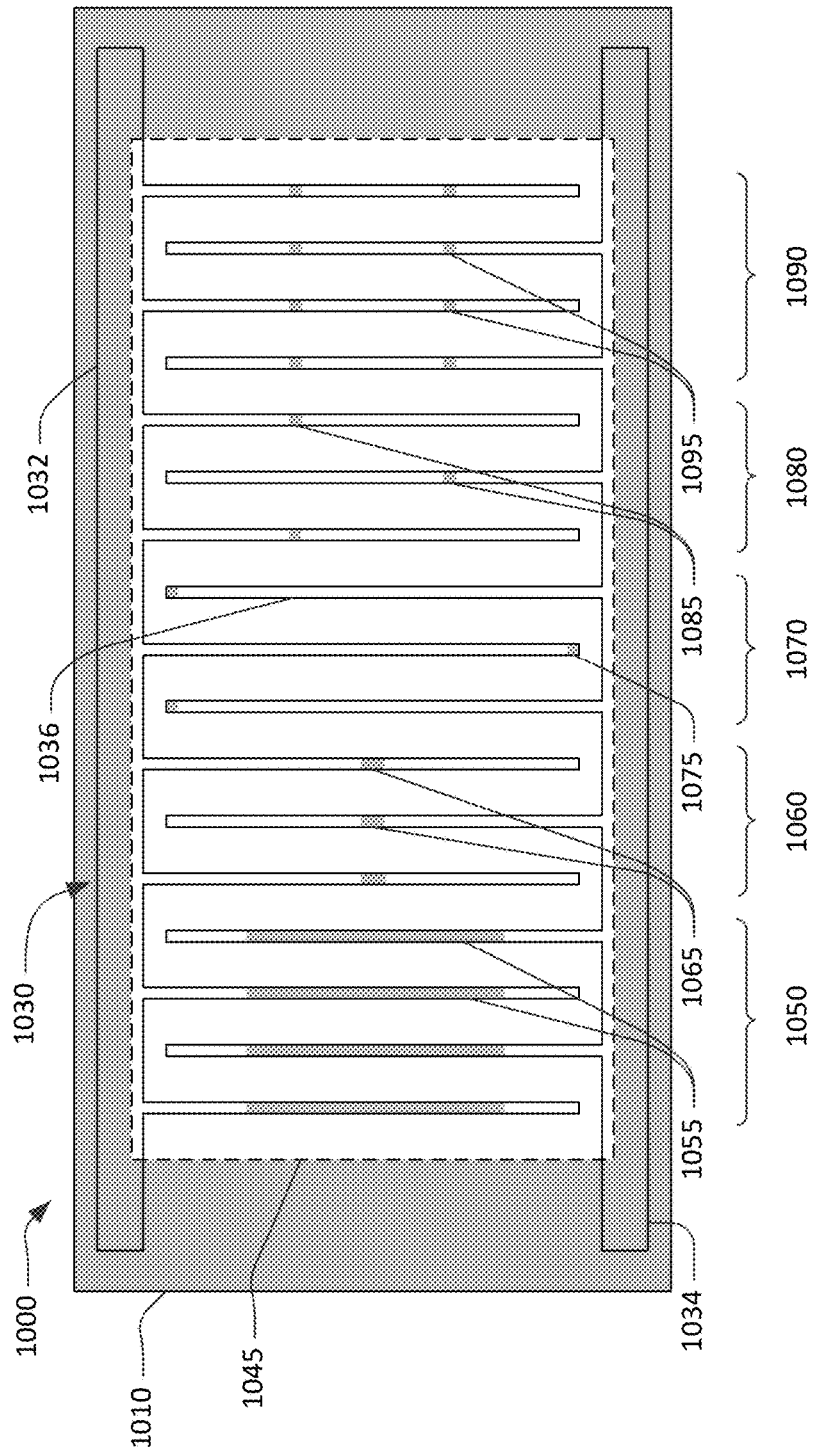
FIG. 10 is a schematic plan view of another XBAR with diaphragm support pedestals.

FIG. 10 is a schematic plan view of an XBAR 1000 with diaphragm support pedestals. The XBAR 1000 includes an IDT 1030 formed on a surface of a piezoelectric plate 1010. The dashed line 1045 is the perimeter of a cavity formed in a substrate behind the piezoelectric plate. A portion of the piezoelectric plate 1010 within the dashed rectangle 1045 forms a diaphragm suspended over the cavity. The IDT 1030 includes a first bus bar 1032, a second bus bar 1034, and a plurality of interleaved fingers, such as finger 1036, extending alternately from the first and second bus bars 1032, 1034. The interleaved fingers are disposed on the diaphragm. Shaded areas indicate where the piezoelectric plate is supported by the substrate or by diaphragm support pedestals extending from the substrate.

The XBAR 1000 is divided into five sections 1050, 1060, 1070, 1080, 1090 for the purpose of illustrating possible diaphragm support pedestal arrangements. The diaphragm support pedestals in section 1050 are ribs 1055 that extend along roughly the center half of each IDT finger. The diaphragm support pedestals in section 1060 are posts 1065 located at about the center of each IDT finger. The diaphragm support pedestals in section 1070 are posts 1075 located at the ends of the IDT fingers. The diaphragm support pedestals in section 1080 are posts 1085 located in alternating positions along the IDT fingers. The diaphragm support pedestals in section 1090 include two posts 1095 aligned with each IDT finger.

The diaphragm support pedestal arrangements in sections 1050, 1060, 1070, 1080, and 1090 of the XBAR 1000 are examples of the nearly unlimited number of arrangements of diaphragm support pedestals that are possible. A diaphragm support pedestal may be a rib that supports a diaphragm along the entire aperture of an XBAR or may be a post with an approximately square cross-section. A diaphragm support pedestal may be any size between these two extremes. None, one, two, or more diaphragm support pedestals may be aligned with each IDT finger. In all cases, the width of a diaphragm support pedestal will be less than or equal to the width of the IDT finger with which it is aligned. Any diaphragm support pedestal shape or arrangement, such as those shown in FIG. 10, could be aligned with every n'th IDT finger, where n is an integer between 2 and about 20, as previously shown in FIG. 9A and FIG. 9B for the case where n=3.

Description of Methods

Figure 11:
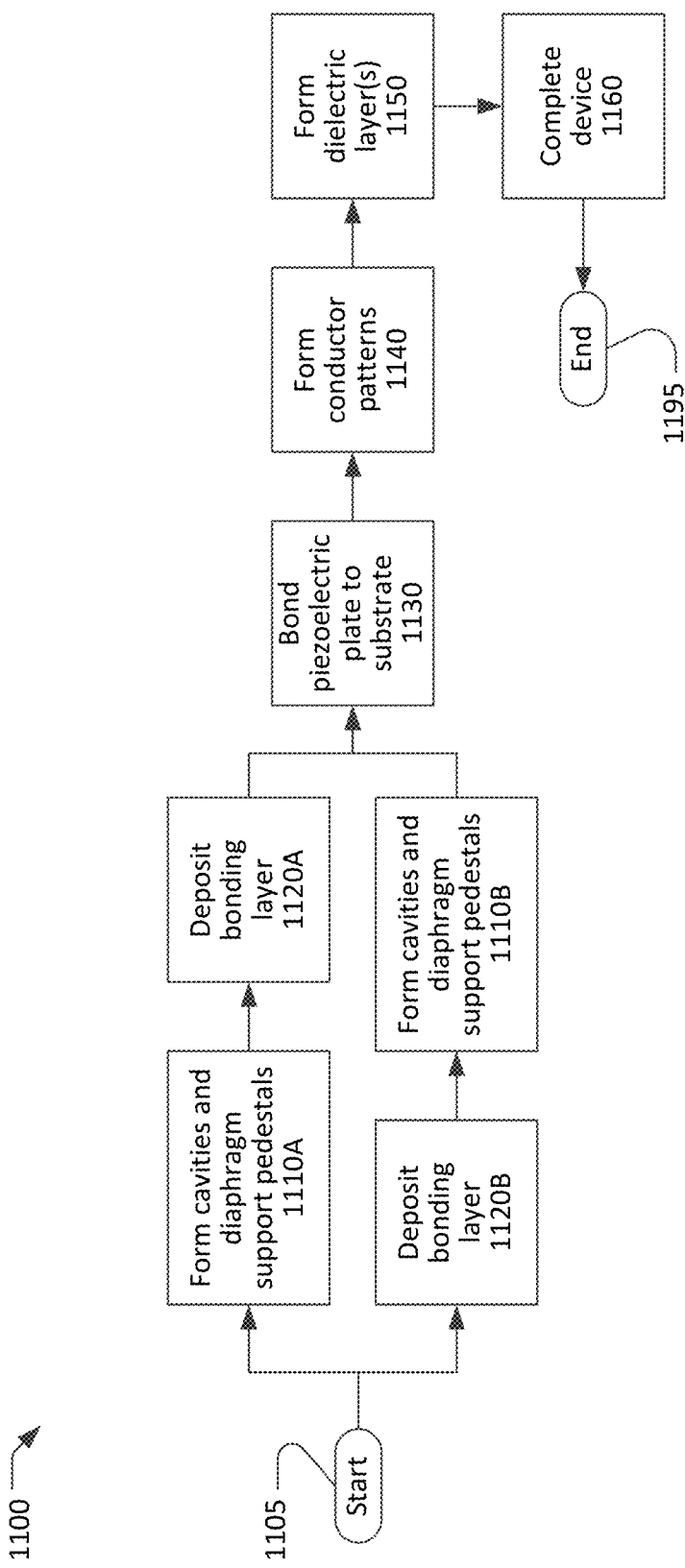
FIG. 11 is a is a flow chart of a process for fabricating an acoustic resonator or filter.

FIG. 11 is a simplified flow chart showing a process 1100 for making an XBAR or a filter incorporating XBARs. The process 1100 starts at 1105 with a substrate and a plate of piezoelectric material and ends at 1195 with a completed XBAR or filter. The flow chart of FIG. 11 includes only major process steps. Various conventional process steps (e.g. surface preparation, cleaning, inspection, baking, annealing, monitoring, testing, etc.) may be performed before, between, after, and during the steps shown in FIG. 11.

The piezoelectric plate may be, for example, Z-cut, rotated ZY-cut or rotated YX cut lithium niobate. The substrate may preferably be silicon. The substrate may be some other material that allows formation of deep cavities by etching or other processing.

In a first embodiment of the process 1100, one or more cavities are formed in the substrate at 1110A. For example, a separate cavity may be formed for each resonator in a filter device. In some filters, resonators may be divided into sub-resonators connected in parallel. In this case, a separate cavity may be formed for each sub-resonator. Each cavity may contain none, one, few, or many diaphragm support pedestals. Each diaphragm support pedestal is a portion of the substrate not removed when the cavities are formed. The cavities and diaphragm support pedestals may be formed using conventional photolithographic and anisotropic etching techniques. For example, when the substrate is silicon, the cavities and diaphragm support pedestals may be formed using anisotropic reactive ion etching.

At 1120A, a bonding layer is deposited over the substrate including the cavities and the diaphragm support pedestals. The bonding layer is a material capable of bonding with the piezoelectric plate using a wafer bonding process. When the substrate is silicon, the bonding layer may be silicon dioxide, aluminum oxide, another metal oxide, or some other material capable of bonding with the piezoelectric plate. After the bonding layer is deposited, each support pedestal will be similar to the support pedestal 825 in FIG. 8A.

In a second embodiment of the process 1100, a bonding layer is deposited over a surface of the substrate at 1120B. When the substrate is silicon, the bonding layer may be silicon dioxide, aluminum oxide, another metal oxide, or some other material capable of bonding with the piezoelectric plate.

At 1110B, one or more cavities are formed in the substrate by etching through the bonding layer deposited at 1120B into the substrate. For example, a separate cavity may be formed for each resonator in a filter device. In some filters, resonators may be divided into sub-resonators connected in parallel. In this case, a separate cavity may be formed for each sub-resonator. Each cavity may contain none, one, few, or many diaphragm support pedestals. Each diaphragm support pedestal is a portion of the substrate not removed when the cavities are formed. The cavities and diaphragm support pedestals may be formed using conventional photolithographic and anisotropic etching techniques. For example, when the substrate is silicon, the cavities and diaphragm support pedestals may be formed using anisotropic reactive ion etching.

In either the first or second embodiments of the process 1100, the bonding layer is formed on all surfaces of the substrate and diaphragm support pedestals that will be bonded to the piezoelectric plate in a subsequent action.

At 1130, the piezoelectric plate is bonded to the substrate surrounding the cavities and to the tops of the diaphragm support pedestals within the cavities. The piezoelectric plate and the substrate may be bonded by a wafer bonding process. Typically, the mating surfaces of the substrate and the piezoelectric plate are highly polished. One or more layers of intermediate materials, such as an oxide or metal, may be formed or deposited on the mating surface of one or both of the piezoelectric plate and the substrate. One or both mating surfaces may be activated using, for example, a plasma process. The mating surfaces may then be pressed together with considerable force to establish molecular bonds between the piezoelectric plate and the substrate or intermediate material layers. At the conclusion of the bonding, the bonding layer is sandwiched between the piezoelectric plate and the substrate and between the piezoelectric plate and the diaphragm support pedestals.

A conductor pattern, including IDTs of each XBAR, is formed at 1140 by depositing and patterning one or more conductor layer on the front side of the piezoelectric plate. The conductor layer may be, for example, aluminum, an aluminum alloy, copper, a copper alloy, or some other conductive metal. Optionally, one or more layers of other materials may be disposed below (i.e. between the conductor layer and the piezoelectric plate) and/or on top of the conductor layer. For example, a thin film of titanium, chrome, or other metal may be used to improve the adhesion between the conductor layer and the piezoelectric plate. A conduction enhancement layer of gold, aluminum, copper or other higher conductivity metal may be formed over portions of the conductor pattern (for example the IDT bus bars and interconnections between the IDTs).

The conductor pattern may be formed at 1140 by depositing the conductor layer and, optionally, one or more other metal layers in sequence over the surface of the piezoelectric plate. The excess metal may then be removed by etching through patterned photoresist. The conductor layer can be etched, for example, by plasma etching, reactive ion etching, wet chemical etching, and other etching techniques.

Alternatively, the conductor pattern may be formed at 1140 using a lift-off process. Photoresist may be deposited over the piezoelectric plate and patterned to define the conductor pattern. The conductor layer and, optionally, one or more other layers may be deposited in sequence over the surface of the piezoelectric plate. The photoresist may then be removed, which removes the excess material, leaving the conductor pattern.

At 1150, a front-side dielectric layer may be formed by depositing one or more layers of dielectric material on the front side of the piezoelectric plate. The one or more dielectric layers may be deposited using a conventional deposition technique such as sputtering, evaporation, or chemical vapor deposition. The one or more dielectric layers may be deposited over the entire surface of the piezoelectric plate, including on top of the conductor pattern. Alternatively, one or more lithography processes (using photomasks) may be used to limit the deposition of the dielectric layers to selected areas of the piezoelectric plate, such as only between the interleaved fingers of the IDTs. Masks may also be used to allow deposition of different thicknesses of dielectric materials on different portions of the piezoelectric plate.

The filter device is completed at 1160. Actions that may occur at 1160 include depositing an encapsulation/passivation layer such as $SiO_2$ or $Si_3O_4$ over all or a portion of the device; forming bonding pads or solder bumps or other means for making connection between the device and external circuitry; excising individual devices from a wafer containing multiple devices; other packaging steps; and testing. Another action that may occur at 1160 is to tune the resonant frequencies of the resonators within the device by adding or removing metal or dielectric material from the front side of the device. After the filter device is completed, the process ends at 1195.

Figure 12:
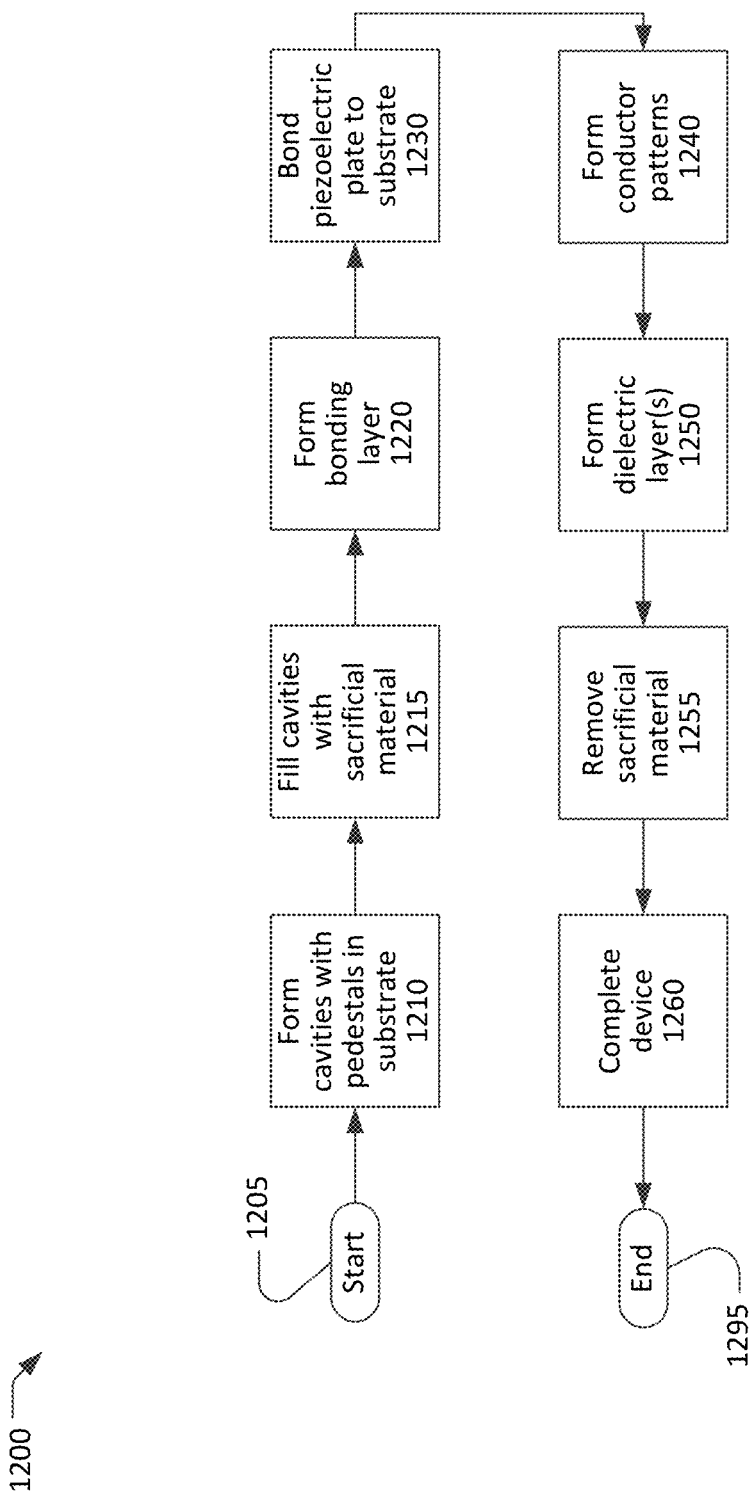
FIG. 12 is a is a flow chart of another process for fabricating an acoustic resonator or filter.

FIG. 12 is a simplified flow chart showing another process 1200 for making an XBAR or a filter incorporating XBARs. The process 1200 starts at 1205 with a substrate and a plate of piezoelectric material and ends at 1295 with a completed XBAR or filter. The flow chart of FIG. 12 includes only major process steps. Various conventional process steps (e.g. surface preparation, cleaning, inspection, baking, annealing, monitoring, testing, etc.) may be performed before, between, after, and during the steps shown in FIG. 12.

The piezoelectric plate may be, for example, Z-cut, rotated ZY-cut or rotated YX cut lithium niobate. The substrate may preferably be silicon. The substrate may be some other material that allows formation of deep cavities by etching or other processing.

One or more cavities are formed in the substrate at 1210. For example, a separate cavity may be formed for each resonator in a filter device. In some filters, resonators may be divided into sub-resonators connected in parallel. In this case, a separate cavity may be formed for each sub-resonator. Each cavity may contain none, one, few, or many diaphragm support pedestals. Each diaphragm support pedestal is a portion of the substrate not removed when the cavities are formed. The cavities and diaphragm support pedestals may be formed using conventional photolithographic and anisotropic etching techniques. For example, when the substrate is silicon, the cavities and diaphragm support pedestals may be formed using anisotropic reactive ion etching.

At 1215, the cavities formed at 1210 are filled with a sacrificial material that will be subsequently removed. The sacrificial material may be different from the material of the substrate. For example, when the substrate is silicon, the sacrificial material may be an oxide, a nitride, a glass, or a polymer material. The sacrificial material may be deposited on the substrate with sufficient thickness to fill the cavities. The excess material may then be removed, for example by chemo-mechanical polishing, to leave a flat surface suitable for bonding to the piezoelectric plate. The excess material may be removed sufficiently to expose the tops of the diaphragm support pedestals.

At 1220, a bonding layer is deposited over the substrate including the filled cavities and the diaphragm support pedestals. The bonding layer is a material capable of bonding with the piezoelectric plate using a wafer bonding process. When the substrate is silicon, the bonding layer may be silicon dioxide, aluminum oxide, another metal oxide, or some other material capable of bonding with the piezoelectric plate.

At 1230, the piezoelectric plate is bonded to the substrate surrounding the cavities, the fill material in the cavities and the tops of the diaphragm support pedestals within the cavities. The piezoelectric plate and the substrate may be bonded by a wafer bonding process. Typically, the mating surfaces of the substrate and the piezoelectric plate are highly polished. One or more layers of intermediate materials, such as an oxide or metal, may be formed or deposited on the mating surface of one or both of the piezoelectric plate and the substrate. One or both mating surfaces may be activated using, for example, a plasma process. The mating surfaces may then be pressed together with considerable force to establish molecular bonds between the piezoelectric plate and the substrate or intermediate material layers. At the conclusion of the bonding, the bonding layer is sandwiched between the piezoelectric plate and the substrate and between the piezoelectric plate and the diaphragm support pedestals.

A conductor pattern, including IDTs of each XBAR, is formed at 1240 as previously described. At 1250, a frontside dielectric layer or layers may be formed as previously described.

At 1255, the sacrificial material is removed from the cavities using an etchant or solvent introduced through openings in the piezoelectric plate. After the sacrificial material is removed, portions of the piezoelectric plate form diaphragms suspended over the cavities and partially support by the diaphragm support pedestals.

The filter device is completed at 1260. Actions that may occur at 1260 include depositing an encapsulation/passivation layer such as $SiO_2$ or $Si_3O_4$ over all or a portion of the device; forming bonding pads or solder bumps or other means for making connection between the device and external circuitry; excising individual devices from a wafer containing multiple devices; other packaging steps; and testing. Another action that may occur at 1260 is to tune the resonant frequencies of the resonators within the device by adding or removing metal or dielectric material from the front side of the device. After the filter device is completed, the process ends at 1295.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. An acoustic resonator device comprising:
   a substrate having a surface;
   a piezoelectric plate having front and back surfaces, the back surface attached to the surface of the substrate except for a portion of the piezoelectric plate forming a diaphragm that spans a cavity in the substrate;
   an interdigital transducer (IDT) formed on the front surface of the piezoelectric plate such that interleaved fingers of the IDT are disposed on the diaphragm, and
   one or more diaphragm support pedestals extending between the substrate and the diaphragm within the cavity.

2. The device of claim 1, wherein the piezoelectric plate and the IDT are configured such that a radio frequency signal applied to the IDT excites a primary shear acoustic mode in the diaphragm.

3. The device of claim 1, wherein each of the one or more diaphragm support pedestals is aligned with a respective finger of the interleaved fingers of the IDT.

4. The device of claim 3, wherein the one or more diaphragm support pedestals comprise diaphragm support pedestals aligned with all of the interleaved fingers of the IDT.

5. The device of claim 3, wherein the one or more diaphragm support pedestals comprise diaphragm support pedestals aligned with every n fingers of the IDT, where n is an integer greater than or equal to two and less than or equal to twenty.

6. The device of claim 3, wherein a width of each of the one or more diaphragm support pedestals is less than or equal to a width of each finger of the interleaved fingers of the IDT.

7. The device of claim 6, wherein a length of each of the one or more diaphragm support pedestals is greater than or equal to the width of the diaphragm support pedestals and less than or equal to an aperture of the IDT.

8. The device of claim 1, further comprising a bonding layer sandwiched between the piezoelectric plate and the substrate and between the piezoelectric plate and the one or more diaphragm support pedestals.

9. A method of fabricating an acoustic resonator device, comprising:
  forming a cavity in a substrate, one or more diaphragm support pedestals disposed within the cavity;
  depositing a bonding layer over the substrate, the cavity, and the one or more diaphragm support pedestals;
  bonding a piezoelectric plate to the substrate and the one or more diaphragm support pedestals such that a portion of the piezoelectric plate forms a diaphragm spanning the cavity with each of the one or more diaphragm support pedestals extending from the substrate to the diaphragm; and
  forming an interdigital transducer (IDT) on a front surface of the piezoelectric plate such that interleaved fingers of the IDT are disposed on the diaphragm.

10. The method of claim 9, wherein the piezoelectric plate and the IDT are configured such that a radio frequency signal applied to the IDT excites a primary shear acoustic mode in the diaphragm.

11. The method of claim 9, wherein each of the one or more diaphragm support pedestals is aligned with a respective finger of the interleaved fingers of the IDT.

12. The method of claim 11, wherein a width of each of the one or more diaphragm support pedestals is less than or equal to a width of each finger of the interleaved fingers of the IDT.

13. A method of fabricating an acoustic resonator device, comprising:
  depositing a bonding layer over a substrate;
  forming a cavity in the substrate and the bonding layer, one or more diaphragm support pedestals disposed within the cavity;
  bonding a piezoelectric plate to the substrate and the one or more diaphragm support pedestals such that a portion of the piezoelectric plate forms a diaphragm spanning the cavity with each of the one or more diaphragm support pedestals extending from the substrate to the diaphragm; and
  forming an interdigital transducer (IDT) on the front surface of the piezoelectric plate such that interleaved fingers of the IDT are disposed on the diaphragm.

14. The method of claim 13, wherein the piezoelectric plate and the IDT are configured such that a radio frequency signal applied to the IDT excites a primary shear acoustic mode in the diaphragm.

15. The method of claim 13, wherein each of the one or more diaphragm support pedestals is aligned with a respective finger of the interleaved fingers of the IDT.

16. The method of claim 15, wherein a width of each of the one or more diaphragm support pedestals is less than or equal to a width of each finger of the interleaved fingers of the IDT.

17. A method of fabricating an acoustic resonator device, comprising:
  forming a cavity in a substrate, one or more diaphragm support pedestals disposed within the cavity;
  filling the cavity with a sacrificial material;
  depositing a bonding layer over the substrate and the sacrificial material;
  bonding a piezoelectric plate to the substrate and the one or more diaphragm support pedestals such that a portion of the piezoelectric plate forms a diaphragm adjacent to the sacrificial material with each of the one or more diaphragm support pedestals extending from the substrate to the diaphragm;
  forming an interdigital transducer (IDT) on the front surface of the piezoelectric plate such that interleaved fingers of the IDT are disposed on the diaphragm; and
  removing the sacrificial material such that the diaphragm spans the cavity.

18. The method of claim 17, wherein the piezoelectric plate and the IDT are configured such that a radio frequency signal applied to the IDT excites a primary shear acoustic mode in the diaphragm.

19. The method of claim 17, wherein each of the one or more diaphragm support pedestals is aligned with a respective finger of the interleaved fingers of the IDT.

20. The method of claim 19, wherein a width of each of the one or more diaphragm support pedestals is less than or equal to a width of each finger of the interleaved fingers of the IDT.

* * * * *